US009269642B2

(12) United States Patent
Coster et al.

(10) Patent No.: US 9,269,642 B2
(45) Date of Patent: Feb. 23, 2016

(54) METHODS FOR TESTING INTEGRATED CIRCUITS OF WAFER AND TESTING STRUCTURES FOR INTEGRATED CIRCUITS (71) Applicant: GLOBALFOUNDRIES INC., Grand Cayman (KY)

(72) Inventors: Michael T. Coster, South Burlington, VT (US); Mark A. DiRocco, South Burlington, VT (US); Jeffrey P. Gambino, Westford, VT (US); Kirk D. Peterson, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 36 days.

(21) Appl. No.: 13/915,947

(22) Filed: Jun. 12, 2013

(65) Prior Publication Data
US 2014/0367684 A1 Dec. 18, 2014

(51) Int. Cl.
H01L 21/66 (2006.01)
H01L 33/62 (2010.01)
H01L 23/48 (2006.01)

(52) U.S. Cl.
CPC .............. *H01L 22/14* (2013.01); *H01L 23/481* (2013.01); *H01L 2924/0002* (2013.01)

(58) Field of Classification Search
CPC ................... H01L 22/32; H01L 22/22; H01L 22/30–22/34; H01L 24/02–24/06; H01L 24/10–24/14; H01L 24/42–24/46; G01R 31/2644
USPC ................................ 257/48, E21.521; 438/14
See application file for complete search history.

(56) References Cited

U.S. PATENT DOCUMENTS

| | | | | |
|---|---|---|---|---|
| 3,519,890 A | * | 7/1970 | Ashby | 361/776 |
| 3,793,474 A | * | 2/1974 | Dunn et al. | 174/529 |
| 4,706,167 A | | 11/1987 | Sullivan | |
| 5,366,906 A | * | 11/1994 | Wojnarowski et al. | 438/17 |
| 5,391,516 A | | 2/1995 | Wojnarowski et al. | |
| 5,483,175 A | | 1/1996 | Ahmad et al. | |
| 5,518,964 A | * | 5/1996 | DiStefano et al. | 438/113 |
| 5,532,174 A | * | 7/1996 | Corrigan | 438/18 |
| 5,593,903 A | * | 1/1997 | Beckenbaugh et al. | 438/18 |
| 5,899,703 A | * | 5/1999 | Kalter et al. | 438/18 |
| 6,063,640 A | * | 5/2000 | Mizukoshi et al. | 438/15 |
| 6,730,529 B1 | | 5/2004 | Kalter et al. | |
| 7,326,293 B2 | * | 2/2008 | Randall et al. | C03B 25/14 117/54 |

(Continued)

OTHER PUBLICATIONS

Marinissen et al., "Testing 3D Chips Containing Through-Silicon Vias", International Test Conference, Paper ET1.1, 2009, IEEE, 11 pages.

(Continued)

*Primary Examiner* — Laura Menz
*Assistant Examiner* — Maliheh Malek
(74) *Attorney, Agent, or Firm* — David Cain; Hoffman Warnick LLC (57) ABSTRACT

Aspects of the present invention relate to methods of testing an integrated circuit of a wafer and testing structures for integrated circuits. The methods include depositing a sacrificial material over a first conductor material of the integrated circuit, and contacting a test probe to the deposited sacrificial material. The methods can also include testing the integrated circuit using the test probe contacting the sacrificial material. Finally, the methods can include removing the sacrificial material over the first conductor material of the integrated circuit subsequent to the testing of the integrated circuit.

13 Claims, 10 Drawing Sheets

(56) References Cited

U.S. PATENT DOCUMENTS

| | | | |
|---|---|---|---|
| 7,944,028 B2* | 5/2011 | Saunders et al. | 257/666 |
| 8,183,683 B1* | 5/2012 | Kim et al. | H01L 24/05 257/690 |
| 2002/0190374 A1* | 12/2002 | Nakajima et al. | 257/707 |
| 2004/0007772 A1* | 1/2004 | Arai et al. | 257/691 |
| 2004/0253845 A1* | 12/2004 | Brown et al. | 439/66 |
| 2004/0253846 A1* | 12/2004 | Brown et al. | 439/66 |
| 2005/0205865 A1* | 9/2005 | Kuan et al. | 257/48 |
| 2005/0252948 A1* | 11/2005 | Oohashi | 228/180.5 |
| 2006/0076159 A1* | 4/2006 | Daubenspeck et al. | 174/261 |
| 2008/0131983 A1* | 6/2008 | Lin et al. | 438/18 |
| 2008/0203577 A1* | 8/2008 | Fukamizu et al. | 257/773 |
| 2009/0146277 A1* | 6/2009 | Tabata | 257/674 |
| 2009/0212797 A1* | 8/2009 | Lee | 324/754 |
| 2009/0289253 A1* | 11/2009 | Pendse | 257/48 |
| 2009/0315613 A1* | 12/2009 | Arai | 327/510 |
| 2010/0013504 A1* | 1/2010 | Wedlake | 324/754 |
| 2010/0117219 A1* | 5/2010 | Oka et al. | 257/693 |
| 2010/0264414 A1* | 10/2010 | Homma et al. | 257/48 |
| 2010/0301884 A1* | 12/2010 | Takane et al. | G01R 1/0735 324/762.06 |
| 2011/0121295 A1* | 5/2011 | Kuan et al. | 257/48 |
| 2013/0048359 A1* | 2/2013 | Ihara | 174/258 |
| 2013/0069683 A1* | 3/2013 | Kuo et al. | 324/755.03 |
| 2013/0285232 A1* | 10/2013 | Ha, Job | 257/696 |
| 2013/0313708 A1* | 11/2013 | Shigihara et al. | 257/738 |
| 2014/0134453 A1* | 5/2014 | Wu; Ming Ting | B32B 15/01 428/614 |
| 2014/0160906 A1* | 6/2014 | Yamada, Yuuichi | 369/13.12 |
| 2015/0079762 A1* | 3/2015 | Nakagawa et al. | 438/463 |

OTHER PUBLICATIONS

Noia et al., "Pre-Bond Probing of TSVs in 3D Stacked ICs", Duke University Dept. Electrical and Computer Engineering, International Test Conference, Paper 17.1, 2011, IEEE, 10 pages.

Yaglioglu et al., "Direct Connection and Testing of TSV and Microbump Devices using NanoPierce! Contactor for 3D-IC Integration", 2012 IEEE 30th VLSI Test Symposium (VTS), 6 pages.

* cited by examiner

METHODS FOR TESTING INTEGRATED CIRCUITS OF WAFER AND TESTING STRUCTURES FOR INTEGRATED CIRCUITS

BACKGROUND

1. Technical Field

The disclosure is related generally to integrated circuits (IC). More particularly, the disclosure is related to methods for testing ICs in a wafer and testing structures for integrated circuits.

2. Related Art

Conventionally, semiconductor wafers undergo a testing process before the wafers are cut into usable chips. The testing process helps manufacturers determine operational characteristics of the ICs included in the wafer. More specifically, by performing a testing process on the ICs, manufacturers may determine the electrical characteristic or capabilities of the ICs and/or may determine if the circuits of the wafer include any undesirable electrical faults (e.g., shorts), created during the manufacturing process of the wafer.

Typically, the wafers are tested by inserting a test probe directly into an electrically-conductive material formed within the ICs of the wafer. The test probe may provide manufacturers with desirable data relating to the operational characteristics of the ICs included in the wafer. However, by inserting the test probe directly into the material of the ICs, the ICs become damaged, and may subsequently include faults or operational issues as a result of the damage caused by the test probe. In conventional processes, after the probe is inserted into the ICs, the wafer may undergo an additional reflowing process, where additional material is added to fix the damaged portion of the wafer (e.g., tested ICs) and/or the materials included in the ICs of the wafer are manipulated (e.g., heated, compressed) to fix the damaged area. This reflowing process adds an additional step to the manufacturing process of the wafers, which results in an increase in manufacturing time and/or cost. Additionally, the reflowing process performed after the testing of the wafer may not result in completely fixing the damaged wafer, which ultimately results in undesirable performance the ICs formed from the wafers.

BRIEF SUMMARY

Methods for testing integrated circuits in a wafer and testing structures for integrated circuits are disclosed. The methods including: depositing a sacrificial material over a first conductor material of the integrated circuit; contacting a test probe to the sacrificial material; testing the integrated circuit using the test probe contacting the sacrificial material; and removing the sacrificial material over the first conductor material of the integrated circuit subsequent to the testing of the integrated circuit.

A first aspect of the invention includes a method for testing an integrated circuit in a wafer. The method includes: depositing a sacrificial material over a first conductor material of the integrated circuit; contacting a test probe to the sacrificial material; testing the integrated circuit using the test probe contacting the sacrificial material; and removing the sacrificial material over the first conductor material of the integrated circuit subsequent to the testing of the integrated circuit.

A second aspect of the invention includes a method for testing an integrated circuit in a wafer. The method includes: depositing an insulating layer over the integrated circuit including a first conductor material of the integrated circuit; removing a portion of the insulating layer positioned over the integrated circuit to expose a portion of the first conductor material of the integrated circuit; depositing a second conductor layer over the insulating layer and the exposed portion of the first conductor material; depositing a sacrificial material over the second conductor layer deposited over the exposed portion of the first conductor material of the integrated circuit; contacting a test probe to the sacrificial material; testing the integrated circuit using the test probe contacting the sacrificial material; and removing the sacrificial material over the second conductor layer, subsequent to the testing of the integrated circuit.

A third aspect of the invention includes a testing structure for an integrated circuit in a wafer. The structure includes: a dielectric layer of the integrated circuit; a first conductor material positioned within the dielectric layer; and a sacrificial material positioned over at least a portion of the first conductor material of the integrated circuit.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As described herein, aspects of the invention relate to integrated circuits (IC). Specifically, as described herein, aspects of the invention relate to methods for testing ICs in a wafer. One method of testing an IC in a wafer may now be described. Turning to FIGS. 1-4, one illustrative method according to various embodiments is shown.

Figure 1:
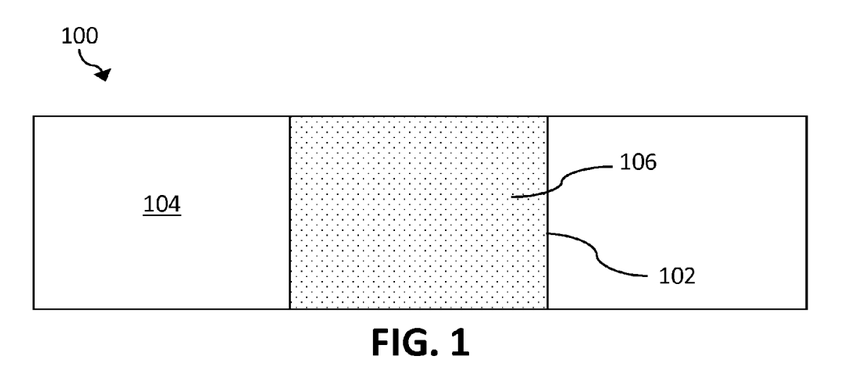
FIGS. 1-4 show a cross-sectional front view of a portion of an integrated circuit (IC) in a wafer undergoing processes according to embodiments of the invention.

FIG. 1 depicts a process according to various embodiments of the invention, the process including providing an IC 100 of a wafer. That is, FIG. 1 shows a cross-sectional view of a portion of IC 100 of a wafer according to embodiments of the invention. As shown in FIG. 1, the portion of IC 100 may include a through-silicon-via (TSV) 102 formed within a dielectric layer 104. More specifically, IC 100 may include a dielectric layer 104 formed from silicon, and a TSV 102 formed through dielectric layer 104. It is understood that the majority of IC 100 is not shown, but rather portion of IC 100, as shown in FIG. 1 includes a last metal layer of IC 100. TSV 102 may be formed through dielectric layer 104 by any now known or later developed material removal process for removing a portion of dielectric layer 104 of IC 100. For example, material removal processes may include any now know or later developed techniques appropriate for the material to be removed including, but not limited to: pattern and etching process, chemical mechanical polish (CMP), photolithographic masking and etching, reactive ion etching (RIE), etc. Although dielectric layer 104 is discussed as being formed from silicon, it is understood that dielectric layer 104 may be formed from any conventional semiconductor material including, but not limited to: germanium, silicon germanium, silicon carbide, and those consisting essentially of one or more III-V compound semiconductors having a composition defined by the formula A1X1GaX2InX3AsY1PY2NY3SbY4, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition ZnA1CdA2SeB1TeB2, where A1, A2, B1, and B2 are relative proportions each greater than or equal to zero and A1+A2+B1+B2=1 (1 being a total mole quantity).

After the formation of TSV 102 in dielectric layer 104 of IC 100, a first conductor material 106 may be positioned within TSV 102. More specifically, as shown in FIG. 1, first conductor material 106 may be deposited within TSV 102 of IC 100, and may be surrounded by dielectric layer 104 of IC 100. First conductor material 106 may form an electrical connection in IC 100 in a wafer. First conductor material 106 may include any conventional material utilized in IC 100 for forming an electrical connection including, but not limited to: copper (Cu), gold (Au), aluminum (Al), silver (Ag), gallium (Ga), germanium (Ge), tin (Sn), etc. As shown in FIG. 1, first conductor material 106 positioned within TSV 102 may be formed using any conventional deposition technique described herein and/or known in the art. For example, deposition techniques or the term "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. It is understood that TSV 102 may also include any conventional refractory metal liner deposited within TSV prior to the positioning of first conductor material 106 within TSV 102. The refractory metal liner may substantially prevent any migration of first conductor material 106 into dielectric layer 104 over the operational life of IC 100.

Figure 2:
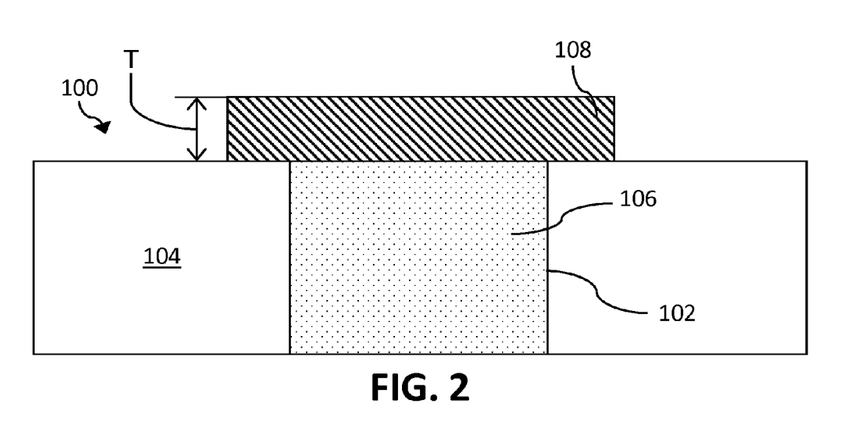

FIG. 2 depicts another process according to various embodiments of the invention, the process including depositing a sacrificial material 108 over first conductor material 106 of IC 100. In an embodiment, sacrificial material 108 may be deposited over at least a portion of first conductor material 106 positioned within TSV 102 of IC 100. More specifically, as shown in FIG. 2, sacrificial material 108 may be deposited over TSV 102 to completely cover first conductor material 106 positioned within TSV 102. Additionally, as shown in FIG. 2, sacrificial material 108 may be deposited over a portion of dielectric layer 104 of IC 100, substantially surrounding first conductor material 106 positioned within TSV 102. Sacrificial material 108 may include any electrically conductive material. More specifically, sacrificial material 108 may include an electrically conductive photoresist or a metal including, but is not limited to, aluminum (Al), tungsten (W), cobalt (Co), etc.

Sacrificial material 108, as shown in FIG. 2, may be formed or deposited over first conductor material 106 positioned within TSV 102 using any conventional deposition technique described herein and/or known in the art. More specifically, sacrificial material 108 may be blanket deposited entirely over first conductor material 106 and dielectric layer 104 of IC 100 using any conventional deposition technique, and sacrificial material 108 may have portions subsequently removed from dielectric layer 104 using any conventional material removal technique described herein and/or known in the art. In depositing sacrificial material 108 over first conductor material 106, sacrificial material 108 may be formed to include a predetermined thickness (T). That is, during the depositing of sacrificial material 108 and/or removal of a portion of sacrificial material 108, sacrificial material 108 may be formed to include a predetermined thickness (T). As discussed herein, the predetermined thickness (T) of sacrificial material 108 may aid in the testing of IC 100.

Figure 3:
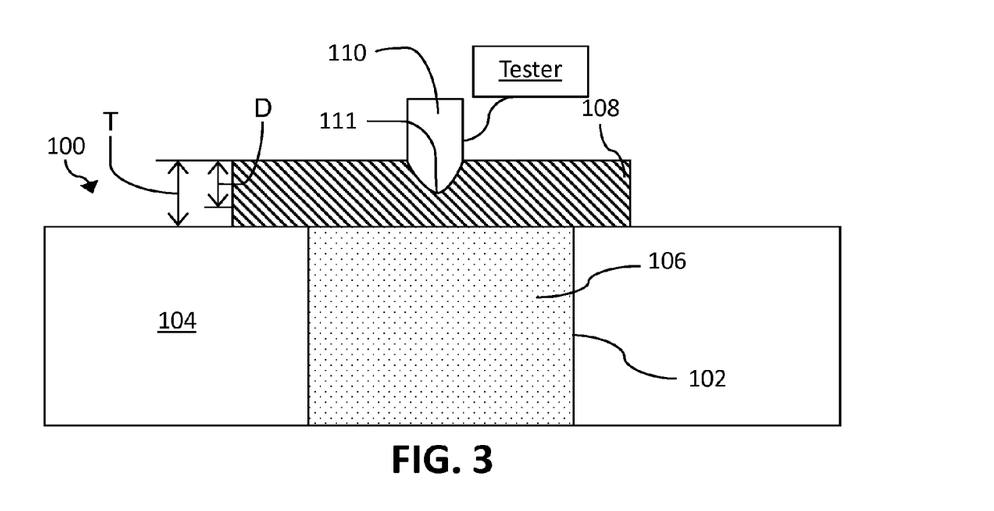

FIG. 3 depicts another process according to various embodiments of the invention, the process including contacting a test probe 110 to sacrificial material 108. As shown in FIG. 3, the contacting of test probe 110 to sacrificial material 108 may include positioning test probe 110 directly above first conductor material 106 positioned within TSV 102. More specifically, test probe 110 may contact sacrificial material 108, and may be positioned directly above first conductor material 106 and within the boundaries formed by TSV 102 formed within IC 100. By positioning test probe 110 directly above first conductor material 106, test probe 110 may obtain a substantially accurate reading when testing the various components of IC 100 electrically connected to first conductor material 106, as discussed herein. The testing of IC 100 may determine the operational characteristics and/or determining undesirable electrical faults (e.g., shorts) of IC 100, as discussed herein. Test probe 110 may include any conventional wafer probe capable of measuring the DC characteristics of first conductor material 106 of IC 100.

Also shown in FIG. 3, the contacting of test probe 110 to sacrificial material 108 may include inserting test probe 110 a predetermined distance (D) into sacrificial material 108, without going through sacrificial material 108 and/or coming in contact with first conductor material 106 positioned within TSV 102 of IC 100. The predetermined distance (D) that test probe 110 may be inserted into sacrificial material 108 may be based upon, at least in part, the predetermined thickness (T) of sacrificial material 108. More specifically, test probe 110 may be inserted into sacrificial material 108 a predetermined distance (D), which may be less than the predetermined thickness (T) of sacrificial material 108, to ensure test probe 110 does not contact first conductor material 106 positioned within TSV 102. As discussed herein, predetermined thickness (T) may be determined during the depositing of sacrificial material 108 over first conductor material 106 positioned within TSV 102. As such, during the inserting of test probe 110 into sacrificial material 108, a user (e.g., integrated circuit manufacturer) or automated device may insert test probe 110 a predetermined distance (D) into sacrificial material 108, which may be less than predetermined thickness (T) of sacrificial material 108. By inserting test probe 110 partially through (e.g., predetermined distance (D)) sacrificial material 108, test probe 110 may not contact first conductor material 106, and ultimately, may not damage first conductor material 106 during the testing process of first conductor material 106 of IC 100, as discussed herein. It may be understood that predetermined distance (D) may also be based upon other characteristics of sacrificial material 108 and/or IC 100. For example, predetermined distance (D) may be based upon, at least in part, the material composition of sacrificial material 108, electrical properties of sacrificial material 108, electrical properties of first conductor material 106, the depth of TSV 102, etc.

FIG. 3 depicts another process according to various embodiments of the invention, the process including testing IC 100 using test probe 110 contacting sacrificial material 108. More specifically, test probe 110 contacting sacrificial material 108 may test IC 100 by allowing test probe 110 to be in electrical communication with IC 100 via sacrificial material 108 and/or first conductor material 106. Test probe 110 may be in electrical communication with IC 100 as a result of sacrificial material 108 and/or first conductor material 106 electrically conductive properties. The testing of IC 100 may aid in determining the operational characteristics and/or aid in determining undesirable electrical faults (e.g., shorts) in IC 100 of a wafer. The testing of IC 100 may include determining electrical characteristics of IC 100. The electrical characteristics of IC 100 and/or the testing of IC 100 may include, for example, measuring the direct current (DC) characteristics of IC 100, measuring the alternating current (AC) characteristics of IC 100, determining input-output (I/O) shorts in IC 100, detecting probe melts, performing a strain and scan test, performing a built-in self-test (BIST), etc. By measuring the electrical characteristics of IC 100, a user (e.g., integrated circuit manufacturer) may determine if IC 100 includes electrical faults or undesirable operations (e.g., electrically shorted). As a result of sacrificial material 108 including any conventional electrically conductive material, test probe 110 may adequately test IC 100 without requiring test probe to be inserted directly into first conductor material 106. That is, sacrificial material 108 includes a material with a predetermined electrical conductivity, which allows test probe 110 to test IC 100, via first conductor material 106, without the need for test probe 110 to directly contact first conductor material 106. As such, first conductor material 106 may not be damaged during the testing process of IC 100 in a wafer. Additionally, it may be understood that because test probe 110 is not directly inserted into first conductor material 106, and therefore a risk of damaging first conductor material 106 is minimized and/or substantially eliminated, test probe 110 does not require sharpening prior to performing each testing process. Further, a tip 111 of test probe 110 may be flat or substantially rounded for providing a larger surface contact area of test probe 110 during the testing of IC 100. As a result of the larger surface contact area of test probe 110, an improved electrical connection may be formed between test probe 110 and IC 100 during the testing, which may allow a user (e.g., integrated circuit manufacturer) to obtain more accurate readings.

Figure 4:
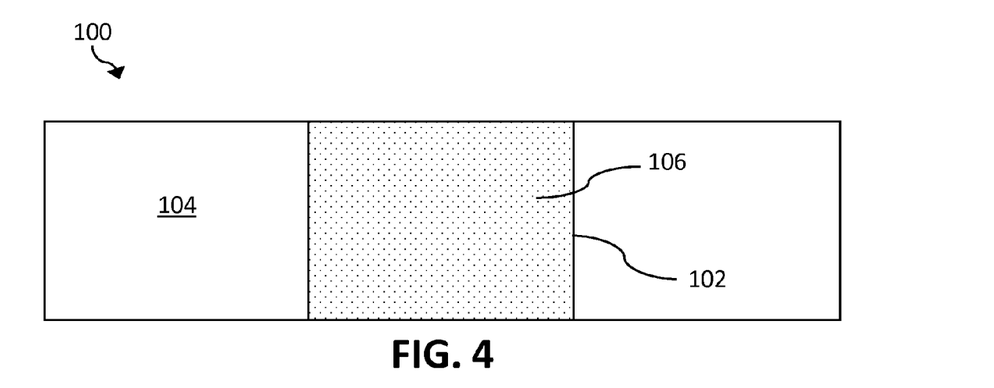

FIG. 4 depicts a further process according to various embodiments of the invention, the process including removing sacrificial material 108 over first conductor material 106 of IC 100. More specifically, subsequent to the testing of IC 100, test probe 110 may be removed from sacrificial material 108, and sacrificial material 108 may then be removed from IC 100. Sacrificial material 108 may be removed using any conventional material removal technique described herein and/or known in the art.

By following the process discussed herein with reference to FIGS. 1-4, IC 100 may be tested without the risk of damaging first conductor material 106 by test probe 110. More specifically, the utilization of sacrificial material 108 in testing IC 100 may allow a user (e.g., integrated circuit manufacturer) to test IC 100 without risk of damaging first conductor material 106 of IC 100. Additionally, by utilizing sacrificial material 108 for testing IC 100, as discussed with respect to FIGS. 1-4, sacrificial material 108 may substantially prevent first conductor material 106 from self-passivation prior to testing. As a result, the utilization of sacrificial material 108 may substantially eliminate the need to clean first conductor material 106 of IC 100, prior to implementation of IC 100 formed from a wafer.

An additional method of testing IC 100 of a wafer may now be described. Turning to FIGS. 5-12, an additional illustrative method according to various embodiments is shown.

Figure 5:
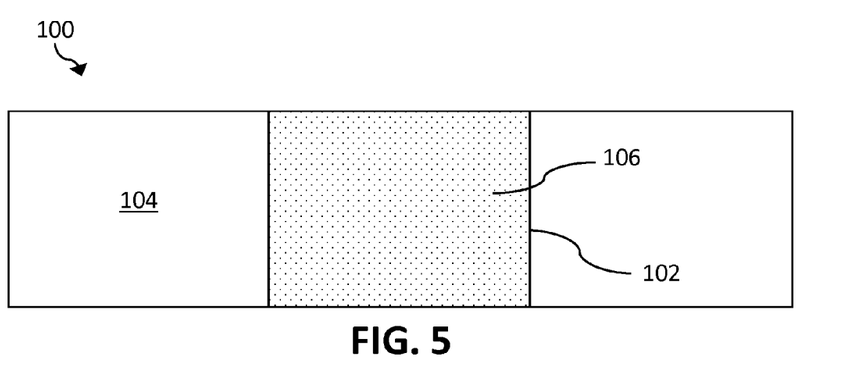
FIGS. 5-12 show a cross-sectional front view of a portion of an IC in a wafer undergoing processes according to alternative embodiments of the invention.

FIG. 5 depicts a process according to various embodiments of the invention, the process including providing IC 100 in a wafer. FIG. 5 shows a cross-sectional view of a portion of IC 100 of a wafer, similar to IC 100 shown in FIG. 1. In the Figures, it is understood that similarly numbered components may represent substantially similar components, which can function in a substantially similar manner. Redundant explanation of these components has been omitted for clarity.

Figure 6:
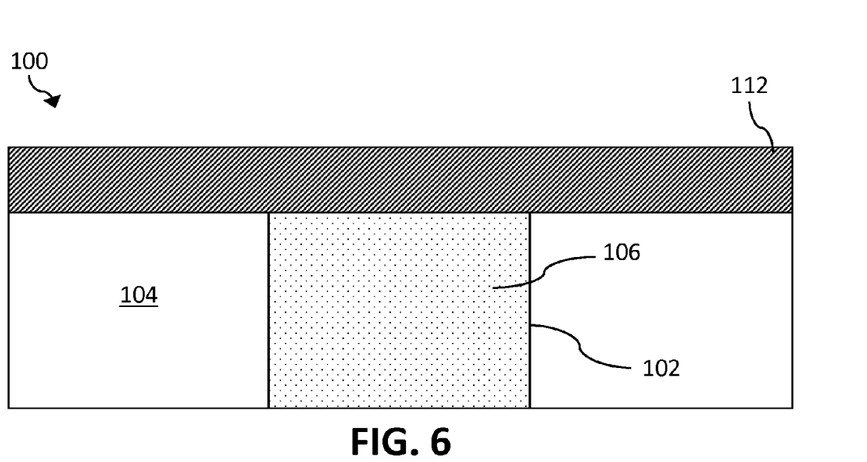

FIG. 6 depicts another process according to various embodiments of the invention, the process including depositing an insulating layer 112 over IC 100, including first conductor material 106 of IC 100. More specifically, as shown in FIG. 6, insulating layer 112 may be deposited over dielectric layer 104 and first conductor material 106 positioned within TSV 102 of IC 100. Insulating layer 112 may be deposited over dielectric layer 104 and first conductor material 106 of IC 100 using any conventional deposition technique described herein and/or known in the art. As discussed herein, insulating layer 112 may be utilized by IC 100, where IC 100 may include a conductor pad 114 (FIG. 12) formed in a wafer.

Figure 7:
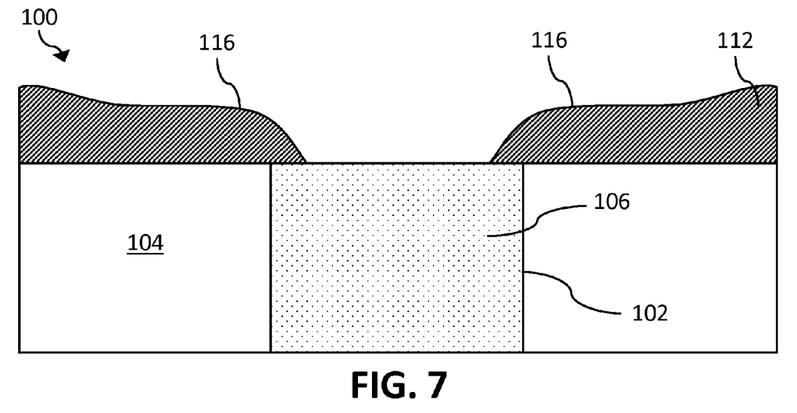

FIG. 7 depicts a further process according to various embodiments of the invention, the process including removing a portion of insulating layer 112 positioned over IC 100 to expose a portion of first conductor material 106 of IC 100. In an embodiment, as shown in FIG. 7, a portion of insulating layer 112 positioned over first conductor material 106 may be removed, and portions of insulating layer 112 positioned substantially over dielectric layer 104 of IC 100 may be removed or planed to form contoured surface 116 of insulating layer 112. Contoured surface 116 of insulating layer 112 may be substantially sloped toward the exposed portion of first conductor material 106 positioned within TSV 102 of IC 100. More specifically, contoured surface 116 may be formed such that a thickness of insulating layer 112 decrease as the insulating layer 112 approaches the exposed portion of first conductor material 106. As discussed herein, contour surface 116 of insulating layer 112 may aid in the self-aligning aspect of forming sacrificial material 108 (FIG. 9) over first conductor material 106 for test probing IC 100. The portions of insulating layer 112 may be removed from IC 100 using any conventional material removal technique described herein and/or known in the art.

Figure 8:
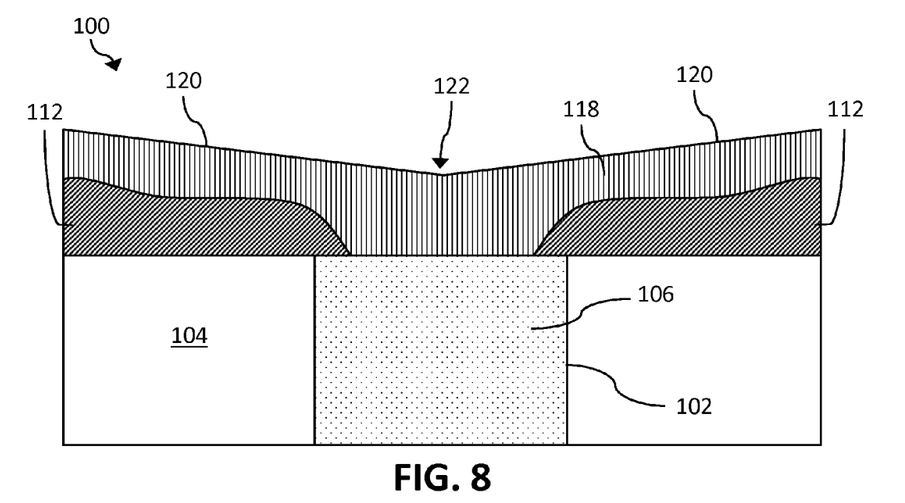

FIG. 8 depicts a further process according to various embodiments of the invention, the process including depositing a second conductor material 118 over insulating layer 112 and the exposed portion of first conductor material 106. More specifically, as shown in FIG. 8, second conductor material 118 may be deposited over contoured surface 116 of insulating layer 112 and may also be deposited over the exposed portion of first conductor material 106 of IC 100. Second conductor material 118 may be deposited over insulating layer 112 and the exposed portion of first conductor material 106 using any conventional deposition technique described herein and/or known in the art. Second conductor material 118 may include any conventional electrically conductive material that may be utilized by a wafer, including, but not limited to: copper (Cu), gold (Au), aluminum (Al), silver (Ag), gallium (Ga), germanium (Ge), tin (Sn), etc.

As shown in FIG. 8, second conductor material 118 may include a substantially angled surface 120 that may be substantially angled toward the exposed portion of first conductor material 106 positioned within TSV 102. That is, second conductor material 118 may be deposited over insulating layer 112 and exposed portion of first conductor material 106, such that angled surface 120 may include a convergence point 122 positioned substantially adjacent and over the center of TSV 102. Angled surface 120 of second conductor material 118 may be formed, at least in part, in the depositing of second conductor material 118 over contoured surface 116 of insulating layer 112. That is, the shape of contoured surface 116 of insulating layer 112, and the portion removed from insulating layer 112 may aid in forming angled surface 120 including convergence point 122 of second conductor material 118. As a result, a portion of second conductor material 118 formed over the exposed portion of first conductor material 106 may be self-aligned and may be positioned for forming conductor pad 114 (FIG. 12), as discussed herein. Additionally, it is understood that angled surface 120 of second conductor material 118 may be formed by depositing second conductor material 118 over insulating layer 112 and the exposed portion of first conductor material 106, and performing a further material removal process to form angled surface 120.

Figure 9:
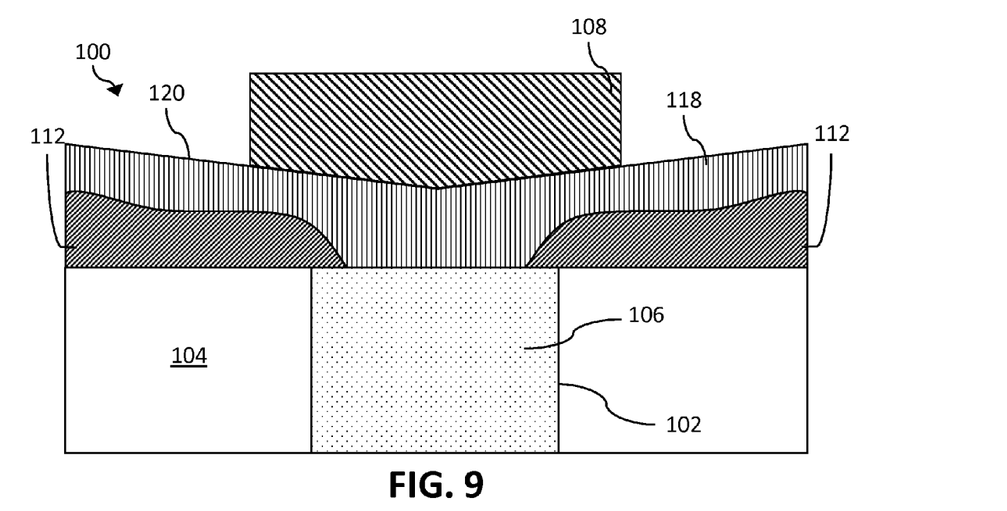

FIG. 9 depicts a further process according to various embodiments of the invention, the process including depositing sacrificial material 108 over second conductor material 118 deposited over the exposed portion of the first conductor material 106 of IC 100. As shown in FIG. 9, sacrificial material 108 may also be deposited substantially over or above first conductor material 106 positioned within TSV 102. In an embodiment, angled surface 120 may aid in self-aligning sacrificial material 108 substantially over or above first conductor material 106 positioned within TSV 102. More specifically, as shown in FIG. 9, as a result of angled surface 120 of second conductor material 118, sacrificial material 108 may be substantially centered on convergence point 122 (FIG. 8) of second conductor material 118, and consequently substantially centered over TSV 102 of IC 100. By depositing sacrificial material 108 over second conductor material 118 and substantially self-aligning sacrificial material 108 over TSV 102, a user (e.g., integrated circuit manufacturer) may obtain desirable readings when test probing IC 100, as discussed herein. Sacrificial material 108 may be deposited over second conductor material 118 using any conventional material removal technique described herein and/or known in the art. Additionally, it may be understood that sacrificial material 108 may be blanket deposited entirely over second conductor material 118 using any conventional deposition technique, and sacrificial material 108 may have portions subsequently removed using any conventional material removal technique described herein and/or known in the art.

Figure 10:
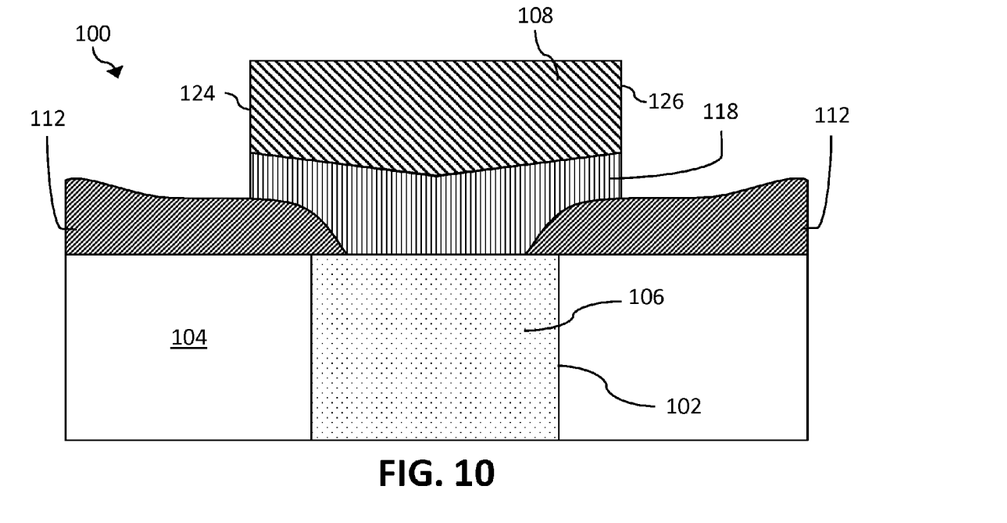

FIG. 10 depicts a further process according to various embodiments of the invention, the process including removing a portion of second conductor material 118. More specifically, as shown in FIG. 10, a portion of second conductor material 118 positioned over insulating layer 112 may be removed, such that second conductor material 118 may be substantially aligned with sacrificial material 108. In FIG. 10, the respective sides 124, 126 of sacrificial material 108 may act as an etch-stop surface utilized in the removal of the portion of second conductor material 118. The portion of second conductor material 118 may be removed using any conventional material removal technique described herein and/or known in the art.

Figure 11:
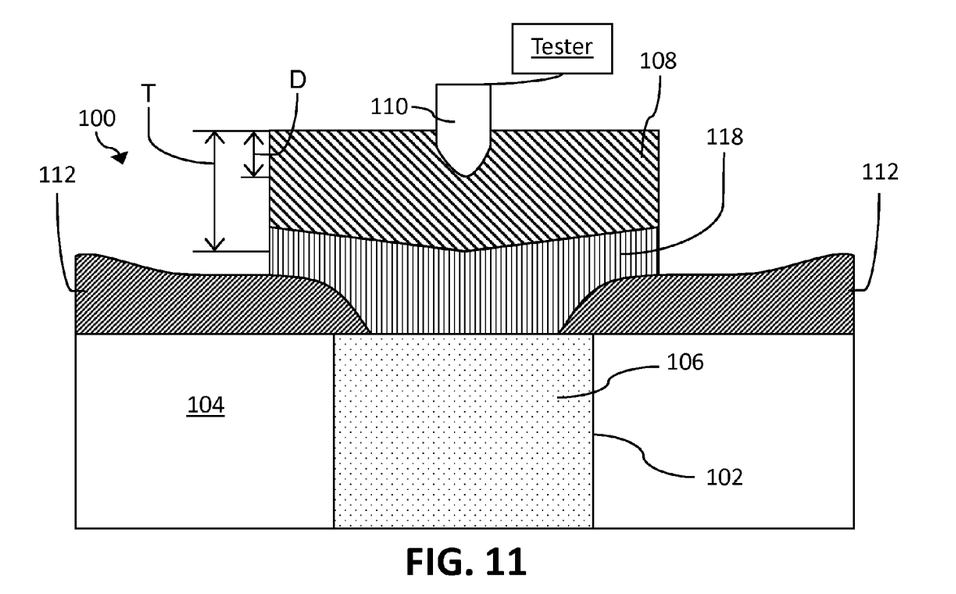

FIG. 11 depicts a further process according to various embodiments of the invention, the process including contacting test probe 110 to sacrificial material 108. Test probe 110, as shown in FIG. 11, may contact, and more specifically, be inserted into sacrificial material 108 in a substantially similar fashion or manner as discussed with reference to FIG. 3. As such, redundant explanation of the process has been omitted for clarity.

FIG. 11 depicts another process according to various embodiments of the invention, the process including testing IC 100 using test probe 110 contacting sacrificial material 108. As shown in FIG. 11, as a result of second conductor materials 118 electrical properties, test probe 110 may obtain a substantially accurate reading when testing IC 100 for determining the operational/electrical characteristics and/or aid in determining undesirable electrical faults (e.g., shorts) of IC 100. That is, although sacrificial material 108 may not be positioned directly adjacent first conductor material 106, and may be separated by second conductor material 118, test probe 110 may obtain substantially accurate readings when testing IC 100 via first conductor material 106. IC 100, as shown in FIG. 11, may be tested in a substantially similar fashion or manner as discussed with reference to FIG. 3. As such, redundant explanation of the process has been omitted for clarity.

Figure 12:
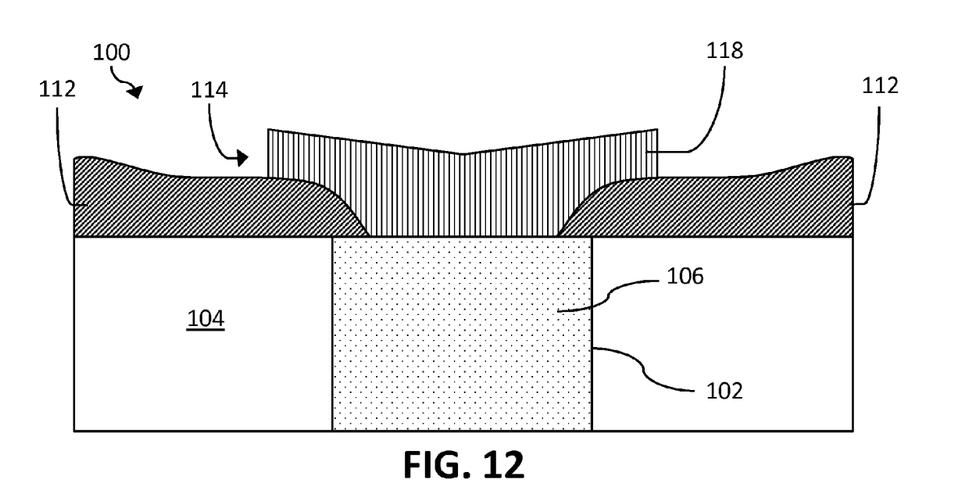

FIG. 12 depicts a further process according to various embodiments of the invention, the process including removing sacrificial material 108 over second conductor material 118, subsequent to the testing of IC 100. As similarly discussed with reference to FIG. 4, sacrificial material 108 may be removed from second conductor material 118 using any conventional material removal technique described herein and/or known in the art. As shown in FIG. 12, and with reference to FIG. 10, the removal of a portion of second conductor material 118 and the removal of sacrificial material 108 may include the formation of conductor pad 114. More specifically, by removing sacrificial material 108, newly shaped second conductor material 118, formed during the process shown in FIG. 10, forms conductor pad 114. As shown in FIG. 12, conductor pad 114 may be used with, for example, a controlled collapse chip connection (C4) for IC 100.

A further method of testing IC 100 of a wafer may now be described. Turning to FIGS. 13-16, a further illustrative method according to various embodiments is shown.

Figure 13:
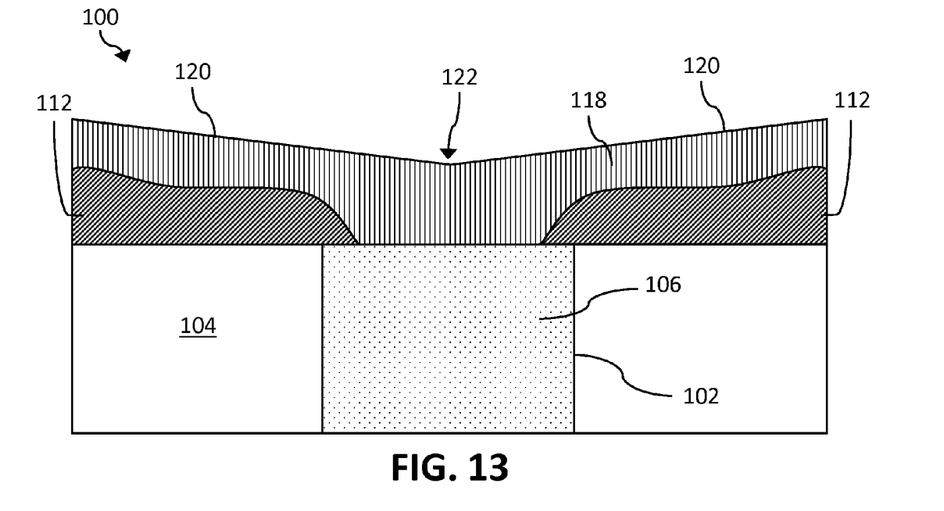
FIGS. 13-16 show a cross-sectional front view of a portion of an IC in a wafer undergoing processes according to further alternative embodiments of the invention.

FIG. 13 shows a cross-sectional view of a portion of IC 100 of a wafer, similar to IC 100 shown in FIG. 8. In an embodiment, as shown in FIG. 13, IC 100 has undergone the processes that are discussed herein within reference to FIGS. 5-8. More specifically, FIG. 13 shows IC 100 which may include a deposited and partial removed portion of insulating layer 112 positioned over IC 100 including first conductor material 106 (FIGS. 5-7), and second conductor material 118 deposited over insulating layer 112 and the exposed portion of first conductor material 106 (FIG. 8). Redundant explanation of these components and/or the formation of these components have been omitted for clarity.

Figure 14:
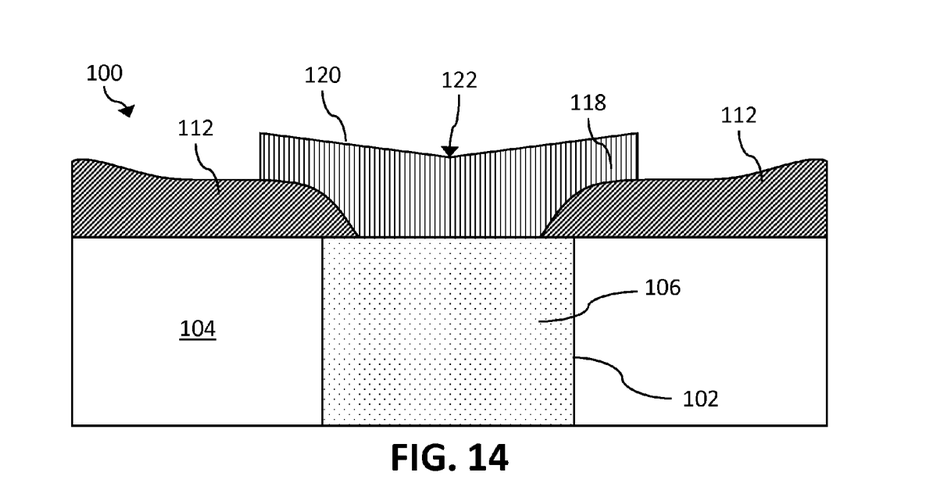

FIG. 14 depicts a further process according to various embodiments of the invention, the process including removing a portion of second conductor material 118 deposited over insulating layer 112. More specifically, as shown in FIG. 14, a portion of second conductor material 118 positioned over insulating layer 112 may be removed, such that second conductor material 118 may be substantially centered on TSV 102 of IC 100. As discussed herein, the removal of a portion of second conductor material 118 may form conductor pad 114 (FIG. 16) for IC 100. The portion of second conductor material 118 may be removed using any conventional material removal technique described herein and/or known in the art.

Figure 15:
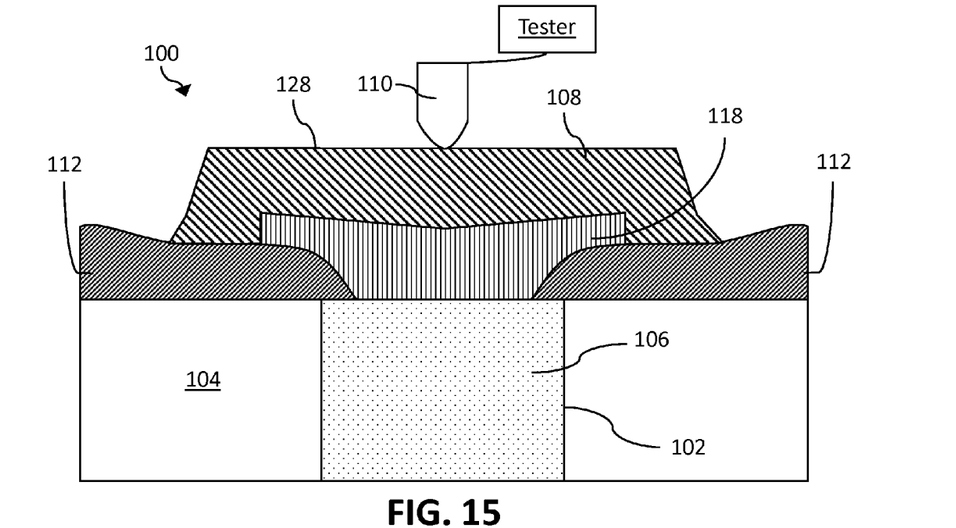
Figure 16:
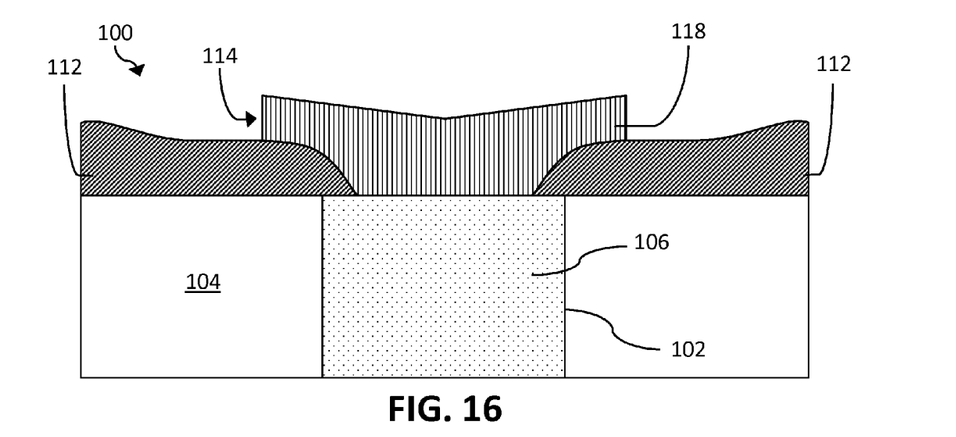

FIG. 15 depicts a further process according to various embodiments of the invention, the process including depositing sacrificial material 108 over second conductor material 118 and a portion of insulating layer 112. As shown in FIG. 15, sacrificial material 108 may be deposited over second conductor material 118 and a portion of insulating layer 112, such that sacrificial material 108 substantially surrounds second conductor material 118. That is, as shown in FIGS. 14 and 15, second conductor material 118 may be shaped or oriented by removing a portion of second conductor material 118 (FIG. 14), prior to the depositing of sacrificial material 108 in IC 100 (FIG. 15). As such, sacrificial material 108 may be deposited over second conductor material 118 and portions of insulating layer 112 without the need to form etch-stop surfaces (e.g., sides 124, 126 (FIG. 10)), for subsequent removal or patterning of second conductor material 118 to form conductor pad 114 (FIG. 16). Sacrificial material 108 may be deposited over second conductor material 118 and a portion of insulating layer 112 using any conventional deposition technique described herein and/or known in the art.

FIG. 15 depicts a further process according to various embodiments of the invention, the process including contacting test probe 110 to sacrificial material 108. More specifically, as shown in FIG. 15, and in comparison to the position of test probe 110 in FIGS. 3 and 11, test probe 110 may only come in contact with a surface 128 of sacrificial material 108, without being substantially inserted into sacrificial material 108. As discussed herein, although test probe 110 may not be inserted partially into sacrificial material 108, test probe 110 contacting surface 128 of sacrificial material 108 may obtain a substantially accurate reading of IC 100 during the testing of IC 100.

FIG. 15 depicts another process according to various embodiments of the invention, the process including testing IC 100 using test probe 110 contacting surface 128 of sacrificial material 108. As shown in FIG. 15, as a result of first conductor material's 106, sacrificial material's 108 and/or second conductor materials 118 electrical properties, test probe 110 may obtain a substantially accurate reading when testing IC 100 for determining the operational/electrical characteristics and/or aid in determining undesirable electrical faults (e.g., shorts) of IC 100. That is, although sacrificial material 108 may not be positioned directly adjacent first conductor material 106, and may be separated by second conductor material 118, test probe 110 may obtain substantially accurate readings when testing IC 100 via first conductor material 106. IC 100, as shown in FIG. 15, may be tested in a substantially similar fashion or manner as discussed with reference to FIGS. 3 and 11. As such, redundant explanation of the process has been omitted for clarity.

FIG. 16 depicts a further process according to various embodiments of the invention, the process including removing sacrificial material 108 over second conductor material 118, subsequent to the testing of IC 100. As similarly discussed with reference to FIGS. 4 and 12, sacrificial material 108 may be removed from second conductor material 118 and a portion of insulating layer 112 using any conventional material removal technique described herein and/or known in the art. As shown in FIG. 16, and with reference to FIG. 14, the removal of sacrificial material 108 may include the formation and/or the exposing of conductor pad 114 of IC 100. More specifically, by removing sacrificial material 108, second conductor material 118, formed during the process shown in FIG. 14, forms conductor pad 114 of IC 100 in a wafer.

An alternative method of testing IC 200 of a wafer may now be described. Turning to FIGS. 17-20, an alternative illustrative method according to various embodiments is shown.

Figure 17:
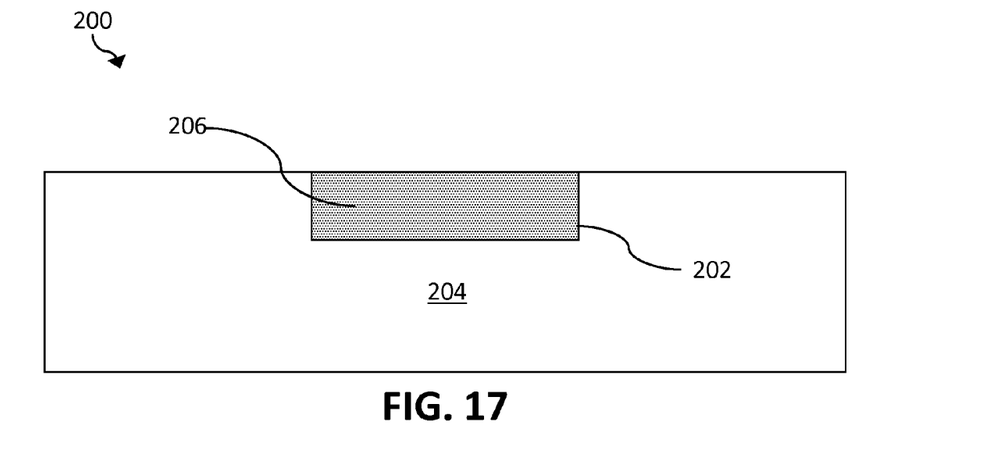
FIGS. 17-20 show a cross-sectional front view of a portion of an IC in a wafer undergoing processes according to additional alternative embodiments of the invention.

FIG. 17 depicts a process according to various embodiments of the invention, the process including providing IC 200 in a wafer. That is, FIG. 17 shows a cross-sectional view of a portion of IC 200 of a wafer according to embodiments of the invention. As shown in FIG. 17, the portion of IC 200 may include a wire via 202 formed within a dielectric layer 204. In comparison to FIG. 1, wire via 202 may only extend partially through dielectric layer 204. Additionally, it is understood that the portion of IC 200, as shown in FIG. 17, may depict any of a variety of layers of IC 100, which may include wire via 202. As shown in FIG. 17, IC 200 may include first conductor material 206 positioned within wire via 202 extending only partially through dielectric layer 204. In comparing FIGS. 1-4 and FIGS. 17-20, IC 100 and the components (e.g., dielectric layer 104, first conductor material 106, etc.) of IC 100 may be substantially similar to IC 200 and the components (dielectric layer 204, first conductor material 206, etc.) of IC 200. As such it is understood that in the Figures, similarly numbered components (e.g., dielectric layer 104, dielectric layer 204) may represent substantially similar components, which can function in a substantially similar manner. Redundant explanation of these components has been omitted for clarity.

Figure 18:
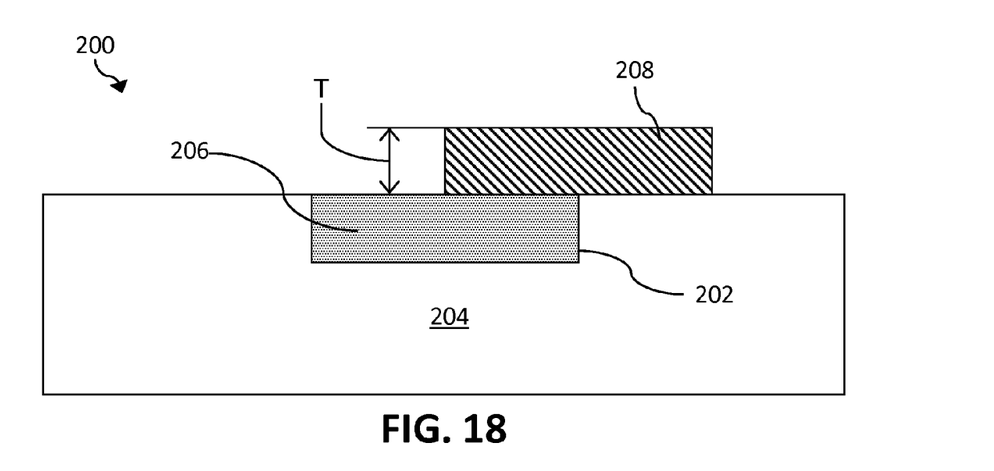

FIG. 18 depicts a further process according to various embodiments of the invention, the process including depositing sacrificial material 208 over at least a portion of first conductor material 206 of IC 200. More specifically, as shown in FIG. 18, sacrificial material 208 may be deposited over a portion, but not entirely over, first conductor material 206 positioned within wire via 202, and may be deposited over a portion of dielectric layer 204 of IC 200. That is, sacrificial material 208 may be deposited substantially offset from the center of wire via 202 of IC 200, such that sacrificial material 208 covers only a portion of first conductor material 206 positioned within wire via 202. Sacrificial material 208 may be formed or deposited over first conductor material 206 positioned within wire via 202 and dielectric layer 204 using any conventional deposition technique described herein and/or known in the art. More specifically, sacrificial material 208 may be blanket deposited entirely over first conductor material 206 and dielectric layer 204 of IC 200 using any conventional deposition technique, and sacrificial material 208 may have portions subsequently removed from dielectric layer 204 and first conductor material 206 using any conventional material removal technique described herein and/or known in the art. As similarly discussed herein with respect to FIG. 2, the depositing of sacrificial material 208 over a portion of first conductor material 206 and dielectric layer 204 may include depositing sacrificial material 208 to include a predetermined thickness (T). As discussed herein, the predetermined thickness (T) of sacrificial material 208 may aid in the testing of IC 200.

Figure 19:
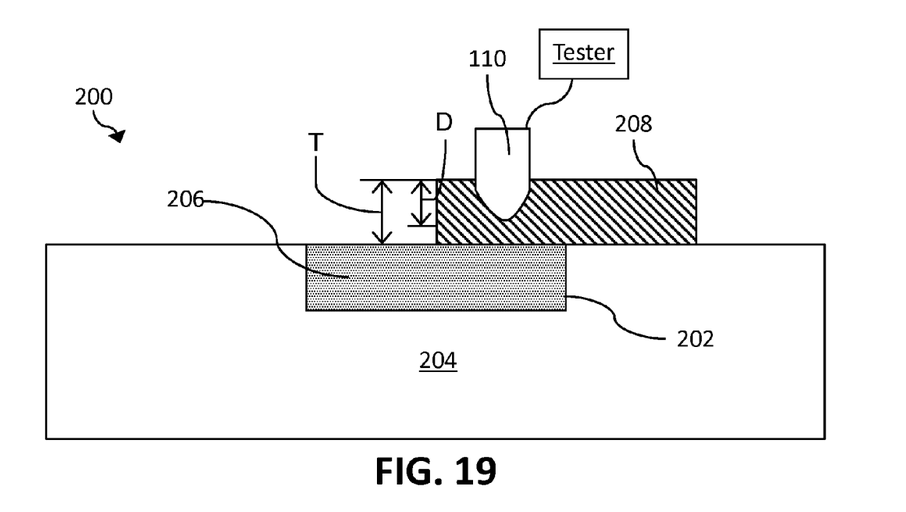

FIG. 19 depicts a further process according to various embodiments of the invention, the process including contacting test probe 110 to sacrificial material 208. In an embodiment, as shown in FIG. 19, although sacrificial material 208 may not entirely cover first conductor material 206 positioned within wire via 202, test probe 110 may be positioned above first conductor material 206 of IC 200. That is, as shown in FIG. 19, the contacting of test probe 110 to sacrificial material 208 may include positioning test probe 110 directly above first conductor material 206, such that test probe 110 may be positioned within the boundaries formed by wire via 202 formed within IC 200. Additionally, the contacting of test probe 110 to sacrificial material 108, as shown in FIG. 19, may include inserting test probe 110 into sacrificial material 208 in a substantially similar fashion or manner as discussed with reference to FIGS. 3 and 11. As such, redundant explanation of the process has been omitted for clarity.

FIG. 19 depicts a further process according to various embodiments of the invention, the process including testing IC 200 using test probe 110 contacting sacrificial material 208. By contacting test probe 110 to sacrificial material 208 directly above first conductor material 206, test probe 110 may obtain a substantially accurate reading when testing IC 200 for determining the operational/electrical characteristics and/or determining undesirable electrical faults (e.g., shorts) of IC 200. IC 200, as shown in FIG. 19, may be tested in a substantially similar fashion or manner as discussed with reference to FIGS. 3, 11 and 15. As such, redundant explanation of the process has been omitted for clarity.

Figure 20:
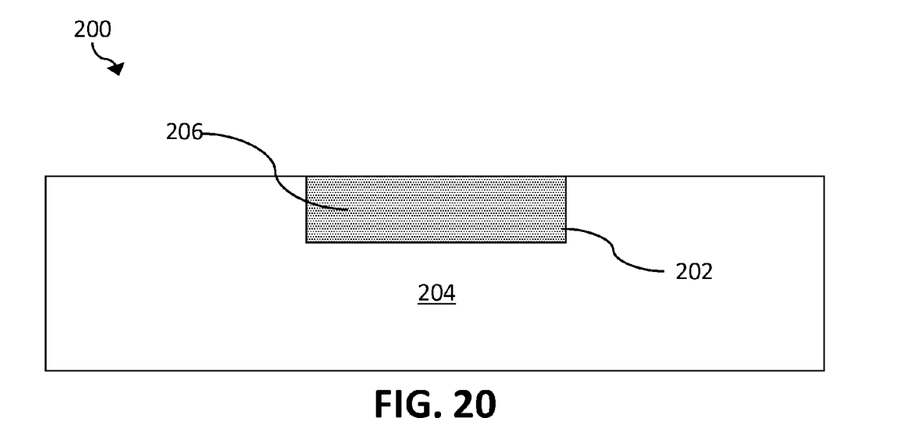

FIG. 20 depicts a further process according to various embodiments of the invention, the process including removing sacrificial material 208 over at least the portion of first conductor material 206 of IC 200, subsequent to the testing of IC 200. More specifically, as shown in FIG. 20, sacrificial material 208 may be removed from the portion of first conductor material 206 positioned within wire via 202 and dielectric layer 204 of IC 200. The removal of sacrificial material 208 may allow IC 200 to be formed a wafer. Sacrificial material 208 may be removed using any conventional material removal technique described herein and/or known in the art.

By following the processes and various methods discussed herein with reference to FIGS. 5-20, IC 100 (FIGS. 5-16) and/or IC 200 (FIGS. 17-20) may be tested without the risk of damage caused by test probe 110. More specifically, the depositing, testing and removing of sacrificial material 108, 208 may allow a user (e.g., integrated circuit manufacturer) to test IC 100, 200 without risk of damaging first conductor material 106 of IC 100 (FIGS. 5-16) and/or first conductor material 206 of IC 200 (FIGS. 17-20). Additionally, by utilizing sacrificial material 108, 208 for testing IC 100, 200, as discussed with respect to FIGS. 5-20, sacrificial material 108, 208 may substantially prevent first conductor material 106, 208 from self-passivation prior to testing. As a result, the utilization of sacrificial material 108, 208, and processed discussed herein, may substantially eliminate the need to clean first conductor material 106 of IC 100 (FIGS. 5-16) and/or first conductor material 206 of IC 200 (FIGS. 17-20), prior to the implementation of IC 100, 200 formed for a wafer.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for testing an integrated circuit in a wafer, the method comprising:
   depositing an insulating layer over the integrated circuit including a first conductor material of the integrated circuit;
   removing a portion of the insulating layer positioned over the integrated circuit to expose a portion of the first conductor material of the integrated circuit;
   depositing a second conductor material over the insulating layer and the exposed portion of the first conductor material;
   depositing a sacrificial material over the first conductor material of the integrated circuit,
   wherein the depositing of the insulating layer over the integrated circuit including the first conductor material of the integrated circuit is performed prior to the depositing of the sacrificial material;
   depositing the sacrificial material over the second conductor material;
   removing a portion of the second conductor material after the depositing of the second conductor material;
   contacting a test probe to the sacrificial material;
   testing the integrated circuit using the test probe contacting the sacrificial material; and
   removing the sacrificial material over the first conductor material of the integrated circuit subsequent to the testing of the integrated circuit.

2. The method of claim 1, wherein the depositing of the sacrificial material includes depositing the sacrificial material over at least a portion of the first conductor material of the integrated circuit.

3. The method of claim 1, wherein the sacrificial material includes an electrically conductive material.

4. The method of claim 1, wherein the testing of the integrated circuit includes determining electrical characteristics of the integrated circuit.

5. The method of claim 1, wherein the contacting of the test probe to the sacrificial material includes positioning the test probe directly above the first conductor material of the integrated circuit.

6. The method of claim 1, wherein the contacting of the test probe to the sacrificial material includes inserting the test probe a predetermined distance into the sacrificial material based upon a thickness of the sacrificial material.

7. A method for testing an integrated circuit in a wafer, the method comprising:
   depositing an insulating layer over the integrated circuit including a first conductor material of the integrated circuit;
   removing a portion of the insulating layer positioned over the integrated circuit to expose a portion of the first conductor material of the integrated circuit;
   depositing a second conductor material over the insulating layer and the exposed portion of the first conductor material;
   removing a portion of the second conductor material deposited over the insulating layer;
   depositing a sacrificial material over the second conductor material deposited over the exposed portion of the first conductor material of the integrated circuit, and depositing the sacrificial material over a portion of the insulating layer, wherein the removing of the portion of the insulating layer positioned over the integrated circuit to expose the portion of the first conductor material of the integrated circuit is performed prior to the depositing of the sacrificial material over the second conductor material;

contacting a test probe to the sacrificial material;

testing the integrated circuit using the test probe contacting the sacrificial material; and removing the sacrificial material over the second conductor material, subsequent to the testing of the integrated circuit.

8. The method of claim 7, wherein the sacrificial material includes an electrically conductive material.

9. The method of claim 7, wherein the testing of the integrated circuit includes determining electrical characteristics of the integrated circuit.

10. The method of claim 7, wherein the contacting of the test probe to the sacrificial material includes positioning the test probe directly above the first conductor material of the integrated circuit.

11. The method of claim 7, wherein the contacting of the test probe to the sacrificial material includes inserting the test probe a predetermined distance into the sacrificial material based upon a thickness of the sacrificial material.

12. The method of claim 7, further comprising:

prior to the inserting of the test probe partially through the sacrificial material, removing a portion of the second conductor material.

13. The method of claim 7, wherein the depositing of the sacrificial material includes depositing the sacrificial material over at least a portion of the first conductor material of the integrated circuit.

* * * * *